United States Patent

Kadota

[11] Patent Number: 5,965,969
[45] Date of Patent: Oct. 12, 1999

[54] SURFACE ACOUSTIC WAVE DEVICE USING HIGHER ORDER MODE OF LEAKAGE ELASTIC SURFACE ACOUSTIC WAVE

[75] Inventor: Michio Kadota, Kyoto, Japan

[73] Assignee: Murata Manufacturing Co., Ltd., Japan

[21] Appl. No.: 08/755,094

[22] Filed: Nov. 22, 1996

[51] Int. Cl.$^6$ ................................. H03H 9/15
[52] U.S. Cl. ........................................ 310/313 R
[58] Field of Search .......................... 310/313 R

[56] References Cited

U.S. PATENT DOCUMENTS

| | | | |
|---|---|---|---|
| 4,544,857 | 10/1985 | Shimizu | 310/313 B |
| 5,302,877 | 4/1994 | Sato et al. | 310/313 A |
| 5,446,330 | 8/1995 | Eda et al. | 310/313 |
| 5,719,538 | 2/1998 | Kadota | 310/313 A |
| 5,760,522 | 6/1998 | Kobayashi et al. | 310/313 A |

FOREIGN PATENT DOCUMENTS 61-222312  10/1986  Japan ................. H03H 9/25

*Primary Examiner*—Thomas M. Dougherty
*Attorney, Agent, or Firm*—Joseph R. Keating, Esq.; Graham & James LLP

[57] ABSTRACT

A surface acoustic wave device includes a quartz substrate and generates surface acoustic waves having a high sonic speed. A surface acoustic wave device includes a surface wave substrate comprising a quartz substrate on which an ZnO thin film functioning as a piezoelectric thin film is disposed. IDTs comprising respective pairs of comb electrodes are disposed in contact with the ZnO thin film. A thickness and arrangement of the piezoelectric thin film relative to the quartz substrate and comb electrodes is such that a novel higher order mode of leakage elastic surface acoustic waves are generated and effectively used enable operation at higher sonic velocity and higher frequency.

8 Claims, 7 Drawing Sheets

SURFACE ACOUSTIC WAVE DEVICE USING HIGHER ORDER MODE OF LEAKAGE ELASTIC SURFACE ACOUSTIC WAVE

BACKGROUND OF THE INVENTION

1. Field of the Invention

The present invention relates to a surface acoustic wave device including a quartz substrate, and more particularly to a surface acoustic wave device which is formed by laminating a piezoelectric thin film on a quartz substrate and is adapted to generate a newly discovered higher order mode of leakage elastic surface acoustic waves.

2. Description of the Related Art

Heretofore, surface acoustic wave devices have been widely used as, e.g., band-pass filters in mobile communication equipment. The surface acoustic wave device has a structure including at least one interdigital transducer (IDT) comprising at least one pair of comb electrodes disposed in contact with a piezoelectric substance. Such a surface acoustic wave device has been used in various application forms such as resonators and delay lines, in addition to band-pass filters.

As substrate materials of surface acoustic wave devices, there are known piezoelectric single crystals such as $LiNbO_3$, $LiTaO_3$ and quartz. A structure including an IDT disposed on a substrate made of any one of those materials to generate Rayleigh waves has been previously practiced.

Surface acoustic wave devices including quartz substrates have had the problem that, while the quartz substrate exhibits a good temperature characteristic, the Rayleigh waves which are surface acoustic waves generated by the quartz substrate have a low sonic speed.

Meanwhile, it is known that, in a surface acoustic wave device including a quartz substrate, leakage elastic surface acoustic waves are generated in addition to the Rayleigh waves and the sonic speed of these leakage elastic surface acoustic waves are relatively high compared to the sonic speed of the Rayleigh waves. However, the leakage elastic surface acoustic waves are attenuated to a large extent during transmission. This attenuation is due to the fact that the leakage elastic surface acoustic waves have a decay constant which causes the leakage elastic surface acoustic waves to decay and be attenuated. For this reason, it has been difficult to prevent attenuation and make practical use of the leakage elastic surface acoustic waves.

Thus, despite exhibiting a good temperature characteristic, quartz substrates have not been previously used as materials for surface acoustic wave devices required to operate at a relatively higher frequency, because of the low sonic speed of Rayleigh waves, and difficulties preventing attenuation of elastic surface acoustic waves utilizing leakage elastic surface acoustic waves.

SUMMARY OF THE INVENTION

The preferred embodiments of the present invention overcome the disadvantages described above by providing a surface acoustic wave device including a quartz substrate, which generates a newly discovered higher order mode of leakage elastic surface acoustic waves having a high sonic speed and is suitable for operation at a higher frequency.

As a result of carrying out intensive studies with the intent of solving the problems with conventional devices described above, the inventor of this application has achieved the preferred embodiments of the present invention based on the discovery of a higher order mode of leakage elastic surface acoustic waves which have a sonic velocity of about 4,000 m/s to 5,000 m/s and how to avoid attenuation of such novel higher order mode of leakage elastic surface acoustic waves to benefit from the high sonic velocity of such higher order mode of leakage elastic surface acoustic waves.

More specifically, according to a preferred embodiment of the present invention, there is provided a surface acoustic wave device comprising a quartz substrate, a piezoelectric thin film disposed on the quartz substrate, and comb electrodes disposed in contact with the piezoelectric thin film, wherein the arrangement and structure of the piezoelectric thin film and comb electrodes are arranged to generate and effectively use a novel higher order mode of leakage elastic surface acoustic waves.

The inventor of the present application not only discovered that a new higher order mode of leakage elastic surface acoustic waves could be generated with a particular arrangement of a quartz substrate, a piezoelectric thin film and comb electrodes, the inventor also discovered that the decay constant present with the lower order mode of leakage elastic surface acoustic waves is dependent upon a ratio of normalized thickness of the piezoelectric thin film to a wavelength of the surface acoustic waves. The inventor discovered that the decay constant could be almost eliminated in the new higher order mode of leakage elastic surface acoustic wave acoustic waves by arranging the thickness of the piezoelectric thin film to have a desired value and relationship relative to the wavelength of the new higher order mode of leakage elastic surface acoustic waves. Because of the virtual elimination of the decay constant, the new higher order mode of leakage elastic surface acoustic waves are generated and used effectively to provide a surface acoustic wave device which can be used in high sonic velocity and frequency applications.

Previously, those of skill in the art realized the difficulty of making practical use of leakage elastic surface acoustic waves because of large attenuation during transmission caused by the decay constant. Although those of skill in the art realized that leakage elastic surface acoustic waves are generated along with Rayleigh waves in certain surface acoustic wave devices, it was concluded by those of skill in the art that the decay constant could not be avoided and the leakage elastic surface acoustic waves could not be used advantageously in a surface acoustic wave device.

Despite this knowledge of the difficulty of preventing attenuation of leakage elastic surface acoustic waves, the inventor of this application discovered that the decay constant could be minimized, the attenuation of leakage elastic surface acoustic waves could be avoided and a new higher order mode of leakage elastic surface acoustic waves having a high sonic speed could be generated and used advantageously in a surface acoustic wave device.

Based on the discoveries described above, the inventor fabricated and tested prototypes of surface acoustic wave devices utilizing the novel higher order mode of leakage elastic surface acoustic waves. As a result, it has been discovered that a surface acoustic wave device, which produces a high sonic speed and is suitable for operation at a higher frequency, is achieved by disposing a piezoelectric thin film such as ZnO on a quartz substrate, forming comb electrodes in contact with the piezoelectric thin film, and providing a desired thickness of the piezoelectric thin film that is sufficient to generate and effectively use the novel higher order mode of leakage elastic surface acoustic waves.

In other words, the preferred embodiments of the present invention have been achieved on the basis of the experimentally confirmed discovery in accordance with the above-mentioned concept. Such a concept is not simply an extension but is in direct opposition to the past technical knowledge that the practical use of leakage elastic surface acoustic waves is extremely difficult because of large attenuation during transmission. Accordingly, the preferred embodiments of the present invention result from the several discoveries described above.

The preferred embodiments of the present invention could not have been determined by ordinary routine experiments because those of skill in the art did not recognize how to avoid attenuation of leakage elastic surface acoustic waves, the existence of a relationship between the decay constant of leakage elastic surface acoustic waves and the thickness of a piezoelectric thin film, the existence of a higher order mode of leakage elastic surface acoustic waves, how to minimize the decay constant in leakage elastic surface acoustic waves and how to advantageously use such higher order mode of leakage elastic surface acoustic waves.

According to a preferred embodiment of the present invention, assuming that the piezoelectric thin film has a thickness of H and the novel higher order mode of leakage elastic surface acoustic waves has a wavelength of $\lambda$, the normalized thickness $H/\lambda$ of the piezoelectric thin film with respect to that wavelength is preferably within the range of from about 0.28 to about 0.6. In a composite substrate which is formed by disposing a piezoelectric thin film on a quartz substrate, the novel higher order mode of leakage elastic surface acoustic waves can be reliably generated by setting the normalized thickness $H/\lambda$ of the piezoelectric thin film to fall in the above specific preferred range. Although a numerical value of the normalized thickness $H/\lambda$ of the piezoelectric thin film depends on the kind of the piezoelectric thin film used, the cut angle of the quartz substrate and so on, the novel higher order mode of leakage elastic surface acoustic waves can be reliably generated by setting the numerical value to be not less than about 0.28.

The piezoelectric thin film can be formed of any suitable material so long as it exhibits piezoelectric properties. For example, a thin film of ZnO, AlN, $Ta_2O_5$, Cds or other suitable material may be preferably used.

In addition, the cut angle of the quartz substrate used in the preferred embodiments of the present invention is not limited to a certain angle or range of angles. Instead, the novel higher order mode of leakage elastic surface acoustic waves can be generated using almost any cut angle for the quartz substrate.

Furthermore, the surface acoustic wave devices of the preferred embodiments generating the novel higher order mode of leakage elastic surface acoustic waves have a more desirable temperature characteristic which is made closer to 0 than conventional surface acoustic waves devices. Also, the surface acoustic wave devices of the preferred embodiments generating the novel higher order mode of leakage elastic surface acoustic waves have an improved electromechanical coupling coefficient as compared with conventional devices.

These and other elements, features, and advantages of the preferred embodiments of the present invention will be apparent from the following detailed description of the preferred embodiments of the present invention, as illustrated in the accompanying drawings.

DESCRIPTION OF PREFERRED EMBODIMENTS

Preferred embodiments of the present invention described below are based on the discoveries described above. Such discoveries include how to avoid attenuation of leakage elastic surface acoustic waves, the existence of a relationship between the decay constant of leakage elastic surface acoustic waves and the thickness of a piezoelectric thin film, the existence of a higher order mode of leakage elastic surface acoustic waves, how to minimize the decay constant in leakage elastic surface acoustic waves and how to advantageously use such higher order mode of leakage elastic surface acoustic waves.

Using the knowledge of these discoveries, the inventor constructed several preferred embodiments and confirmed the unexpected advantageous results achieved from these discoveries.

Figure 1A:
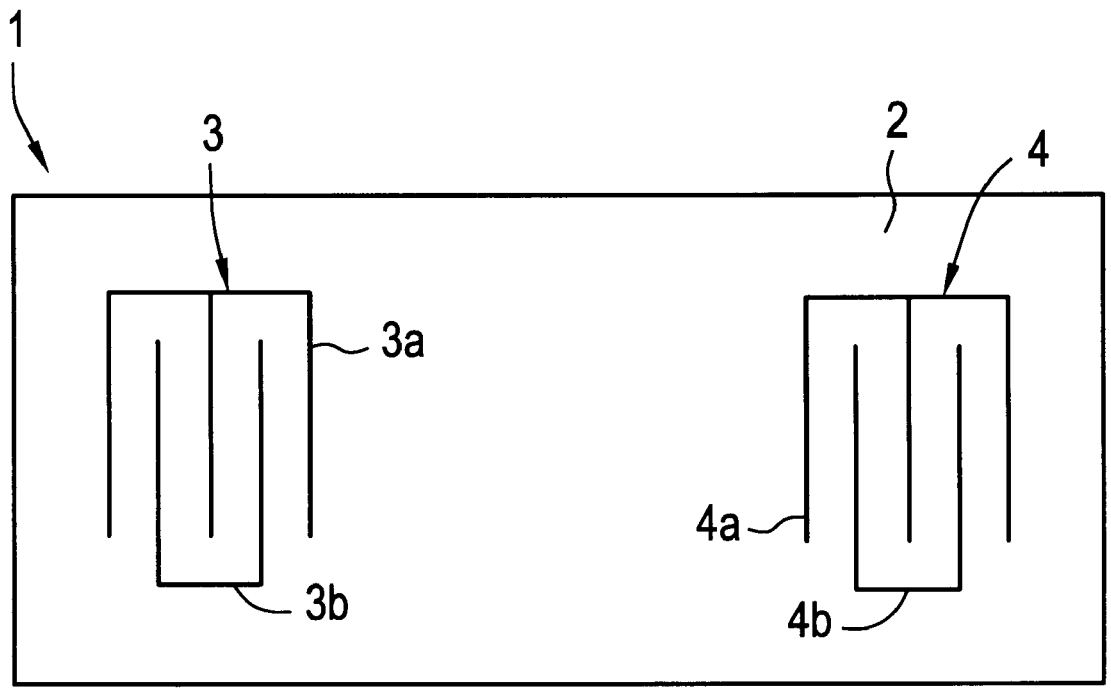
FIGS. 1A and 1B are a schematic plan view and a partial sectional view of a surface acoustic wave filter according to a preferred embodiment of the present invention.
Figure 1B:
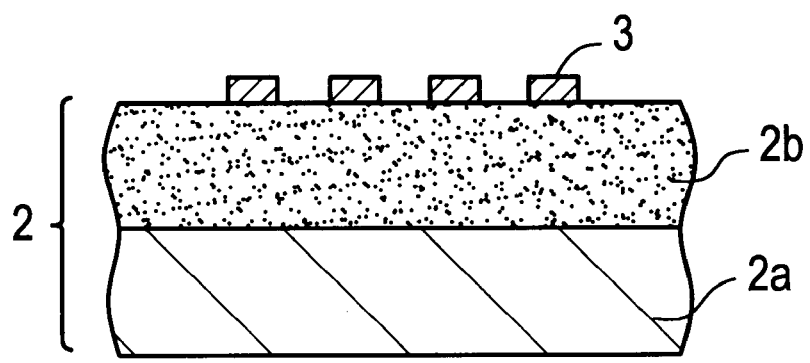

A surface acoustic wave device according to preferred embodiments of the present invention has no particular limitations in its specific form. The surface acoustic wave device can be constructed as, by way of example, a surface acoustic wave filter which is a transversal band-pass filter schematically shown in FIGS. 1A and 1B. A surface acoustic wave filter 1 is constructed of a surface acoustic wave substrate 2 on which IDTs 3, 4 are disposed with a predetermined spacing therebetween. The IDTs 3, 4 comprise respective pairs of comb electrodes 3a, 3b, 4a, 4b, the paired ones of these electrodes being arranged in interdigitated relation. The surface acoustic wave substrate 2 has a piezoelectric thin film 2b disposed on a quartz substrate 2a. In such a structure, the IDTs 3, 4 may be disposed on any of the upper and lower surfaces of the piezoelectric thin film 2b. Thus, although the piezoelectric thin film 2b is shown as being disposed on an upper surface of the quartz substrate 2a and the IDTs 3, 4 being disposed on the upper surface of the piezoelectric thin film 2b, the structure could also be arranged such that the IDTs 3, 4 are disposed on the upper surface of the quartz substrate 2a and the piezoelectric thin film 2b is disposed on the IDTs 3, 4. Also, short-circuiting electrodes (not shown) may be disposed on any of the upper and lower surfaces of the piezoelectric thin film 2b.

It is to be noted that the surface acoustic wave device according to the preferred embodiments of the present invention is not limited to the surface acoustic wave filter mentioned above, and that the preferred embodiments of the present invention are also applicable to various surface acoustic wave devices such as surface acoustic wave resonators and surface acoustic wave delay lines.

Preferred embodiments of the present invention will be described hereinafter with reference to the drawings for clearer understanding of the invention.

First Preferred Embodiment

Figure 2:
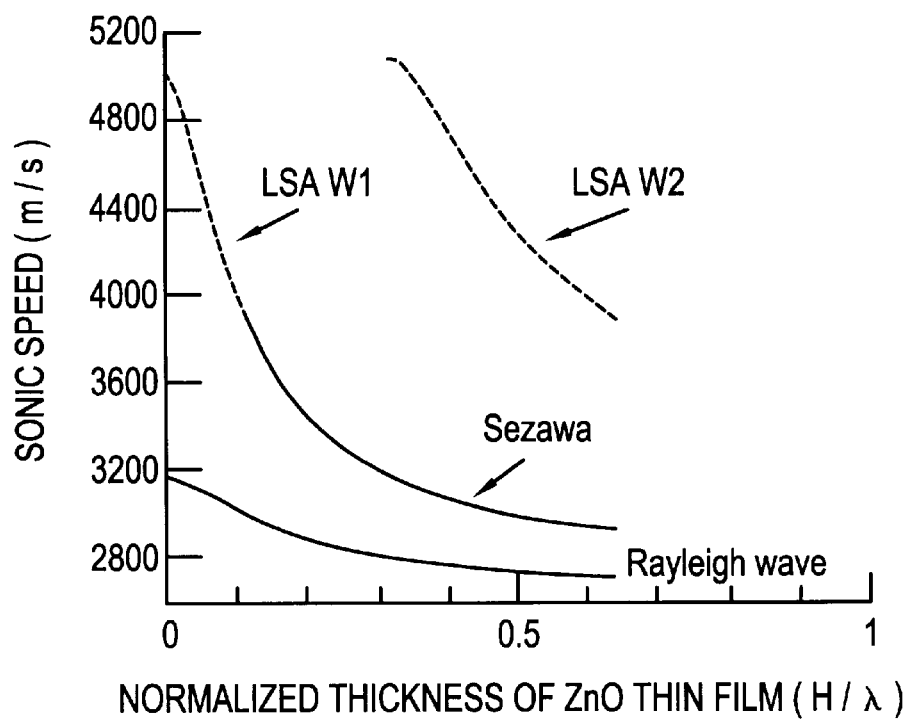
FIG. 2 is a graph showing the relationship between the sonic speeds of surface acoustic waves and the normalized thickness $H/\lambda$ of a ZnO thin film in composite substrates of quartz substrates and ZnO piezoelectric thin films when a quartz substrate having Eulerian angles (0, 141, 0) is used.

FIG. 2 is a graph showing the sonic speeds of surface waves in surface acoustic wave substrates each comprising a quartz substrate with a piezoelectric thin film of ZnO disposed thereon. The quartz substrate used in this one preferred embodiment has the Eulerian angles (0, 141, 0) and dimensions of about 7.62 mm diameter×about 0.5 mm thickness. As mentioned above, many different Eulerian angles and having other dimensions can be used. The surface acoustic wave substrates were fabricated by forming ZnO thin films in various thicknesses all over the surfaces of the quartz substrates.

The sonic speeds of surface acoustic waves in the thus-fabricated various surface acoustic wave substrates having the ZnO thin films of different thicknesses were measured. The measurement of the sonic speeds was made as follows.

IDTs covering the wavelength range of from about 7 μm to about 52 μm were formed on each of the surface acoustic wave substrates and the sonic speed was determined from the central frequency of a resulting SAW filter.

As is apparent from FIG. 2, when the normalized thickness H/λ of the ZnO thin film is zero, i.e., when the ZnO thin film is not formed, only the Rayleigh wave and a basic or lower order mode (LSAW1) of leakage elastic surface acoustic waves are generated. By contrast, for the surface acoustic wave substrates according to the first preferred embodiment having a certain arrangement and thickness of ZnO thin film formed on a quartz substrate, a Sezawa wave as a higher order mode of the Rayleigh wave and a novel higher order mode (LSAW2) of leakage elastic surface acoustic waves are also generated.

Also, as is apparent from FIG. 2, when the normalized thickness H/λ of the ZnO thin film is not less than about 0.28, the novel higher order mode (LSAW2) of leakage elastic surface acoustic waves are generated and exhibit a relatively high sonic speed. For example, when the normalized thickness H/λ of the ZnO thin film is about 0.32, the sonic speed is about 5000 m/sec which is 1.6 times a maximum value of the sonic speed of the Rayleigh wave, i.e., the sonic speed=3170 m/sec of the Rayleigh wave in the quartz substrate without the ZnO thin film.

Accordingly, it is understood that when the surface acoustic wave substrate fabricated by disposing a ZnO thin film on a quartz substrate having Eulerian angles (0, 141, 0) is used, a surface acoustic wave having a high sonic speed can be achieved by arranging the normalized thickness H/λ of the ZnO thin film to be not less than about 0.28.

Figure 3:
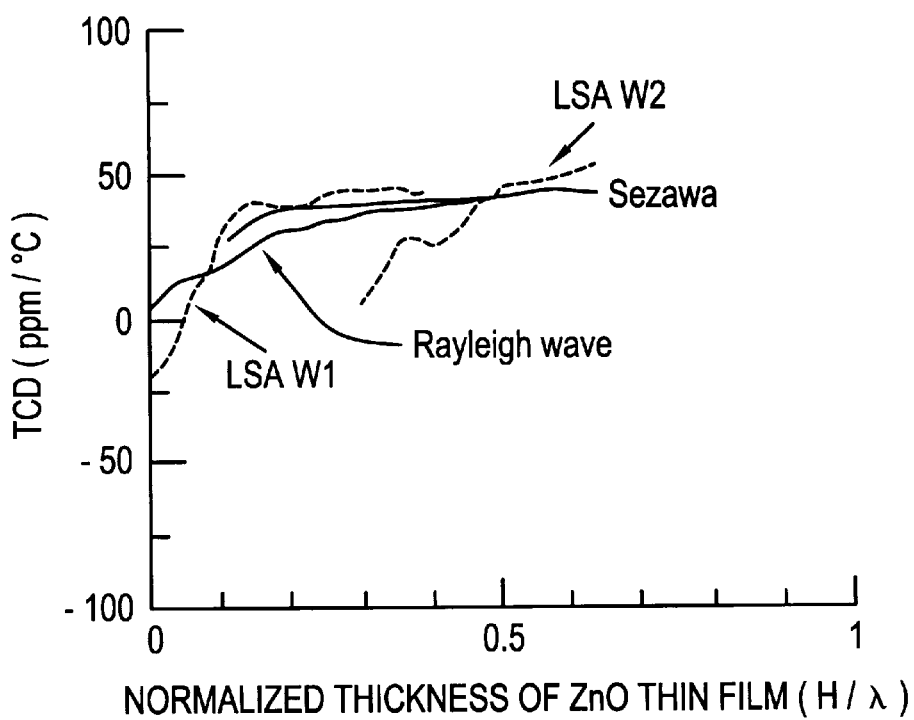
FIG. 3 is a graph showing the relationship between the normalized thickness $H/\lambda$ of a ZnO thin film and a temperature characteristic TCD of surface acoustic wave devices according to a first preferred embodiment.

FIG. 3 is a graph showing the relationship between a temperature characteristic (TCD) and the normalized thickness H/λ of a ZnO thin film in the surface acoustic wave devices each constructed of the surface acoustic wave substrate which was fabricated by forming a piezoelectric thin film on a quartz substrate having the Eulerian angles (0, 141, 0). As seen from FIG. 3, in contrast with the TCD in the quartz substrate without the ZnO thin film, the TCD in the surface acoustic wave substrates having the ZnO thin films laminated thereon shifts to the positive side. It can be therefore understood that the TCD value can be made closer to ±0 by using a quartz substrate with a negative TCD value and disposing a ZnO thin film thereon, and hence that a surface acoustic wave device having a good temperature characteristic can be achieved.

Figure 4:
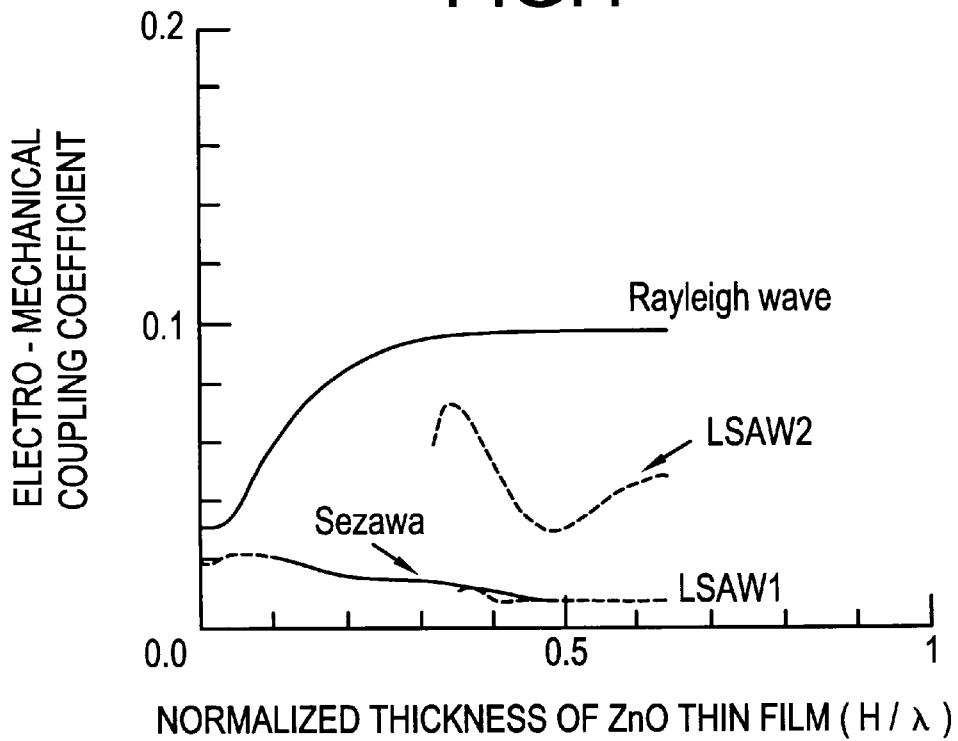
FIG. 4 is a graph showing the relationship between the normalized thickness $H/\lambda$ of a ZnO thin film and the electromechanical coupling coefficient of surface acoustic wave devices of the first preferred embodiment.
Figure 5:
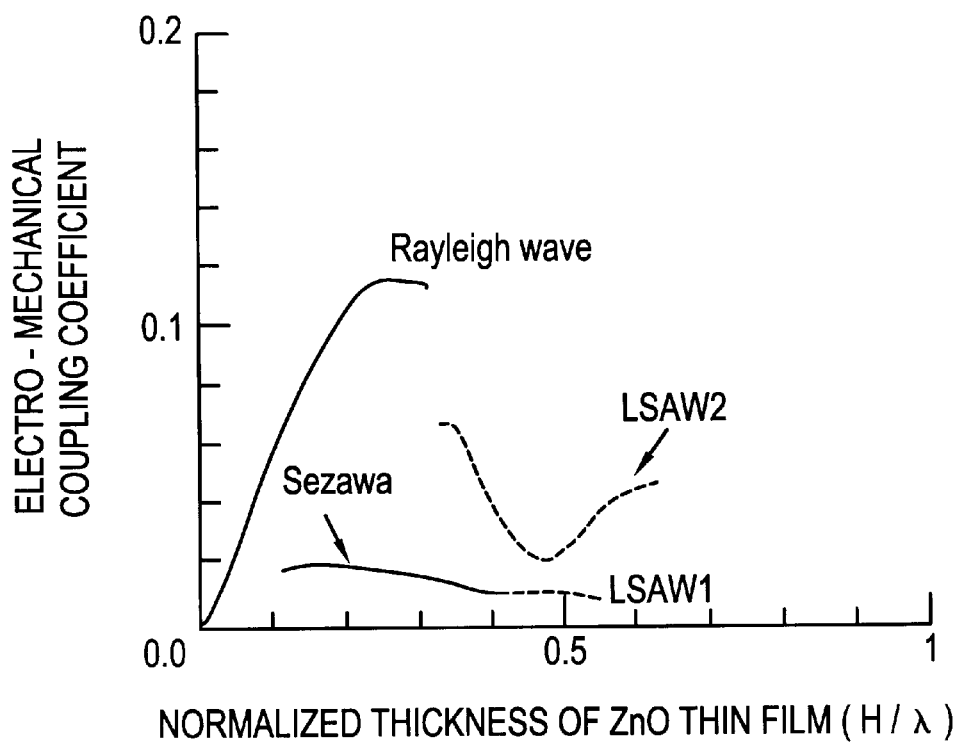
FIG. 5 is a graph showing the relationship between the normalized thickness $H/\lambda$ of a ZnO thin film and the electromechanical coupling coefficient of the surface wave devices of the first preferred embodiment.

FIGS. 4 and 5 are graphs each showing the relationship between the electromechanical coupling coefficient and the normalized thickness H/λ of a ZnO thin film in the surface acoustic wave devices each constructed of the surface acoustic wave substrate which was fabricated by forming a piezoelectric thin film on a quartz substrate having Eulerian angles (0, 141, 0). FIG. 4 shows characteristics achieved when IDTs, i.e., comb electrodes, are disposed on the upper surface of the ZnO thin film, and FIG. 5 shows characteristics achieved when IDTs are disposed on the upper surface of the ZnO thin film and short-circuiting electrodes are disposed at the interface between the ZnO thin film and the quartz substrate.

As is apparent from FIGS. 4 and 5, in any of the surface acoustic wave devices, the novel higher order mode LSAW2 of leakage elastic surface acoustic waves are generated and a relatively large electro-mechanical coupling coefficient is obtained.

Second Preferred Embodiment

Surface acoustic wave devices were fabricated in the same manner as in the first preferred embodiment except that quartz substrates having Eulerian angles (0, 132.75, 89) and being ST-cut at about 89° for transmission were used. Each of the quartz substrates used had dimensions of about 7.62 mm diameter×about 0.5 mm thickness.

Figure 6:
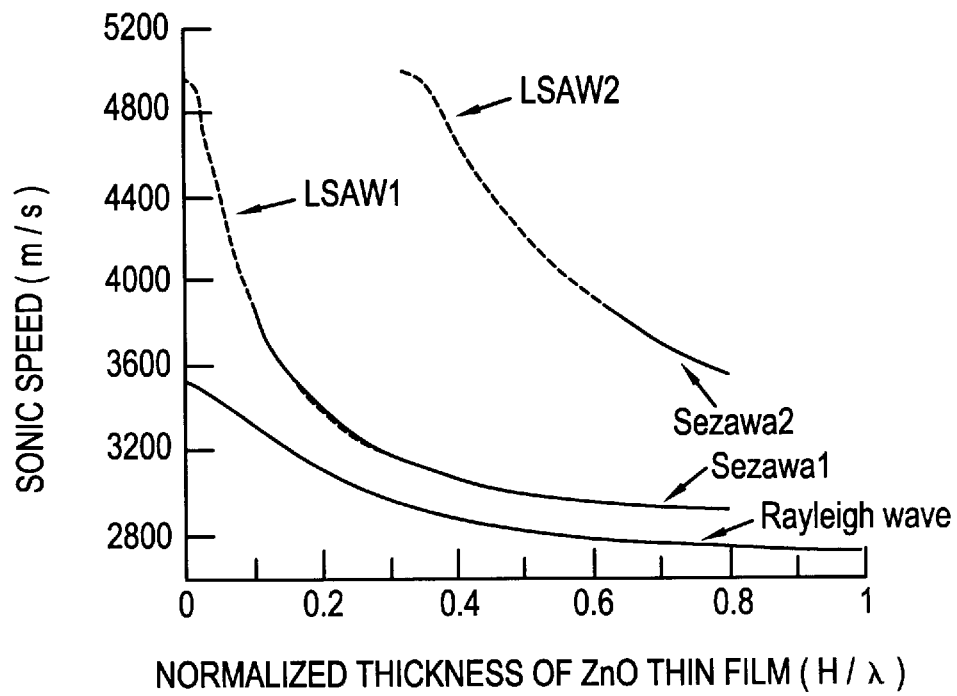
FIG. 6 is a graph showing the relationship between the sonic speeds of surface acoustic waves and the normalized thickness $H/\lambda$ of a ZnO thin film in composite substrates of quartz substrates and ZnO piezoelectric thin films when a quartz substrate having Eulerian angles (0, 132.75, 89) is used.

FIG. 6 shows the relationship between the sonic speeds of surface acoustic waves and the normalized thickness H/λ of a ZnO thin film in the surface acoustic wave devices wherein the ZnO thin films were formed in various thicknesses. As is apparent from FIG. 6, in the case of employing the quartz substrate of the above-mentioned cut angle, the novel higher order mode LSAW2 of leakage elastic surface acoustic waves are also generated when the normalized thickness H/λ of the ZnO thin film is not less than about 0.28. Further, when the normalized thickness H/λ of the ZnO thin film exceeds about 0.6, a higher order mode Sezawa2 of the Sezawa waves is generated rather than the higher order mode LSAW2 of leakage elastic surface acoustic waves.

Accordingly, it is understood that, in the surface acoustic wave devices of the second preferred embodiment, the novel higher order mode of leakage elastic surface acoustic waves is generated by arranging the normalized thickness H/λ of the ZnO thin film to be in the range of from about 0.28 to about 0.6, and hence that the novel higher order mode of leakage elastic surface acoustic waves having a sonic speed higher than the maximum sonic speed available from Rayleigh waves can be utilized.

Figure 7:
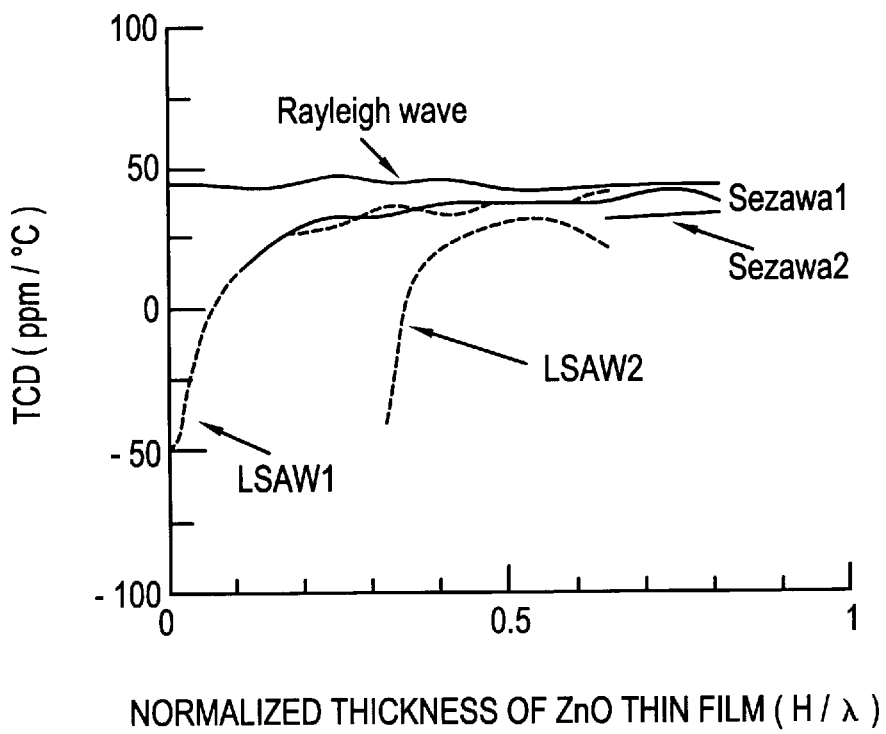
FIG. 7 is a graph showing the relationship between the normalized thickness $H/\lambda$ of a ZnO thin film and a temperature characteristic TCD of surface acoustic wave devices according to a second preferred embodiment.

FIG. 7 is a graph, corresponding to FIG. 3, showing the relationship between a temperature characteristic TCD and the normalized thickness H/λ of the ZnO thin film in the above surface acoustic wave devices of the second preferred embodiment. As is apparent from FIG. 7, in the surface acoustic wave devices each fabricated by forming a ZnO thin film on a quartz substrate having Eulerian angles (0, 132.75, 89), it is also possible to shift the temperature characteristic TCD to the positive side by increasing the thickness of the ZnO thin film. It can be therefore understood that, as with the case of the first preferred embodiment, the surface acoustic wave device having a temperature characteristic value of about ±0 can be achieved by a combination of a quartz substrate with a negative value of the temperature characteristic TCD and a ZnO thin film.

Figure 8:
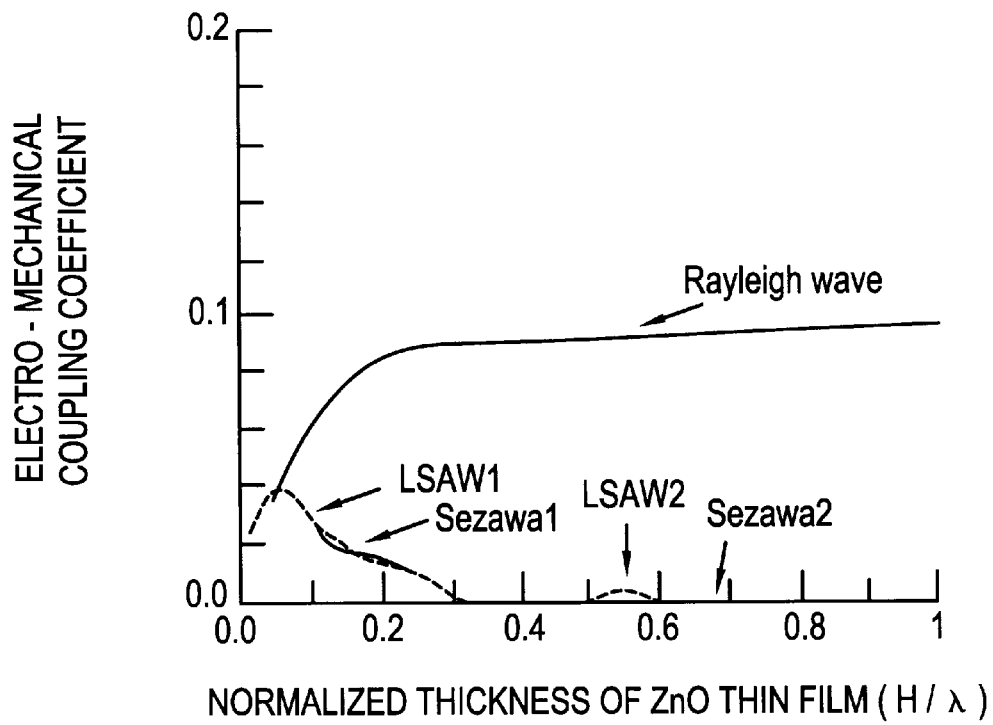
FIG. 8 is a graph showing the relationship between the normalized thickness $H/\lambda$ of a ZnO thin film and the electromechanical coupling coefficient of the surface acoustic wave devices according to the second preferred embodiment.
Figure 9:
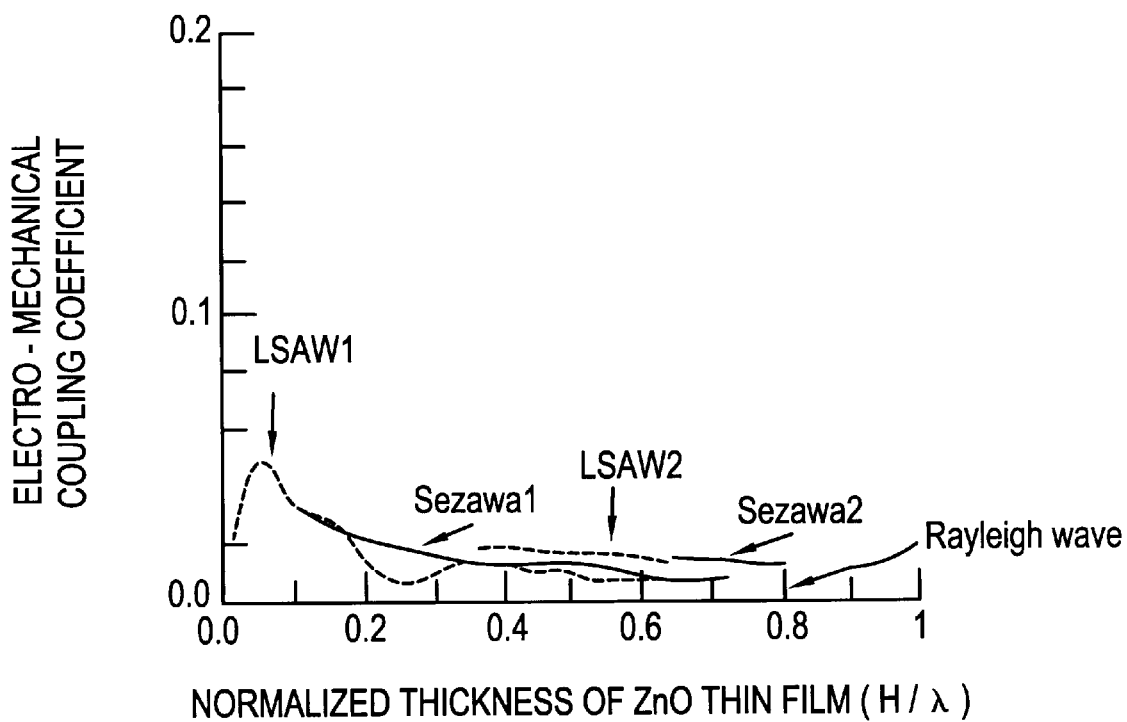
FIG. 9 is a graph showing the relationship between the normalized thickness $H/\lambda$ of a ZnO thin film and the electromechanical coupling coefficient of the surface acoustic wave devices of the second preferred embodiment.

FIGS. 8 and 9 are graphs, corresponding respectively to FIGS. 4 and 5, each showing the relationship between the electromechanical coupling coefficient and the normalized thickness H/λ of a ZnO thin film in the surface acoustic wave devices each fabricated by forming a piezoelectric thin film on a quartz substrate having Eulerian angles (0, 132.75, 89).

It can be understood that, in the case of using the quartz substrate having Eulerian angles (0, 132.75, 89), the surface acoustic wave device having a sufficiently large electromechanical coupling coefficient can also be achieved by disposing a ZnO film on the quartz substrate.

FIG. 8 shows characteristics achieved when comb electrodes are disposed on the upper surface of the ZnO thin film, and FIG. 9 shows characteristics achieved when comb electrodes are disposed on the lower surface of the ZnO thin film.

Third Preferred Embodiment

Figure 10:
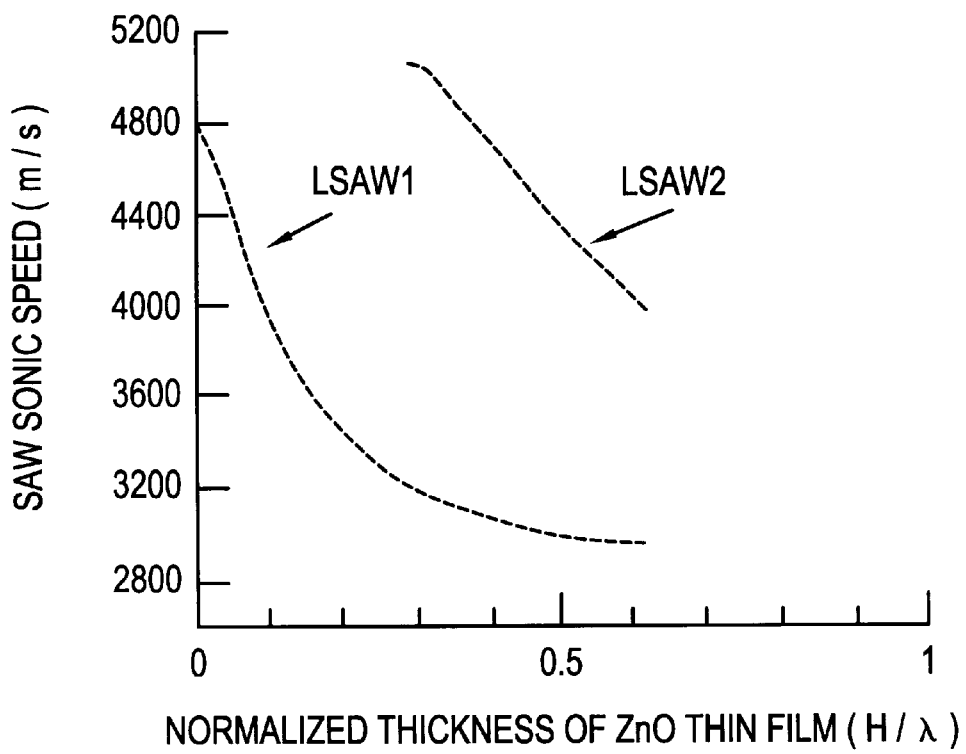
FIG. 10 is a graph showing the relationship between the sonic speeds of surface acoustic waves and the normalized thickness $H/\lambda$ of a ZnO thin film in composite substrates of quartz substrates and ZnO piezoelectric thin films when a quartz substrate having Eulerian angles (0, 150, 0) is used.

Surface acoustic wave devices were fabricated in the same manner as in the first preferred embodiment except that quartz substrates having Eulerian angles (0, 150, 0) were used. FIG. 10 shows the relationship between the sonic speeds of surface acoustic waves and the normalized thickness H/λ of a ZnO thin film in the surface acoustic wave devices wherein the ZnO thin films were formed to have various thicknesses on the quartz substrates having such Eulerian angles.

As is apparent from FIG. 10, in the case of using the quartz substrate having Eulerian angles (0, 150, 0), the novel higher order mode LSAW2 of leakage elastic surface acoustic waves are also generated and a very high sonic speed can be obtained when the normalized thickness H/λ of the ZnO thin film is in the range of from about 0.28 to about 0.6.

Figure 11:
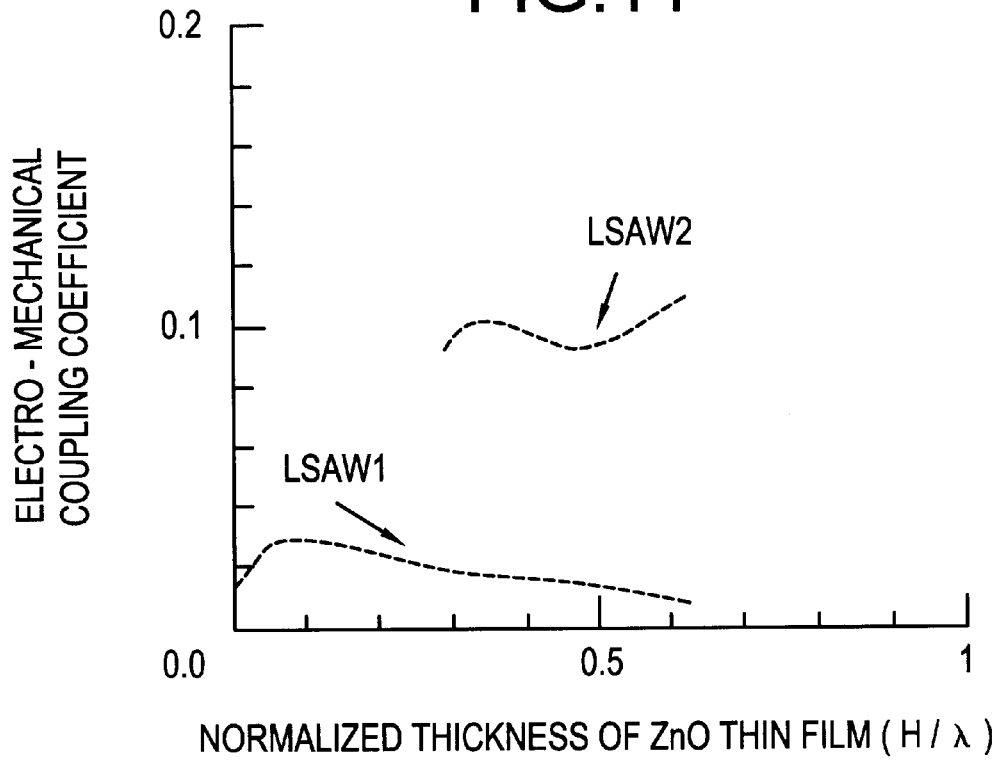
FIG. 11 is a graph showing the relationship between the normalized thickness $H/\lambda$ of a ZnO thin film and the electromechanical coupling coefficient of surface acoustic wave devices of the third preferred embodiment.
Figure 12:
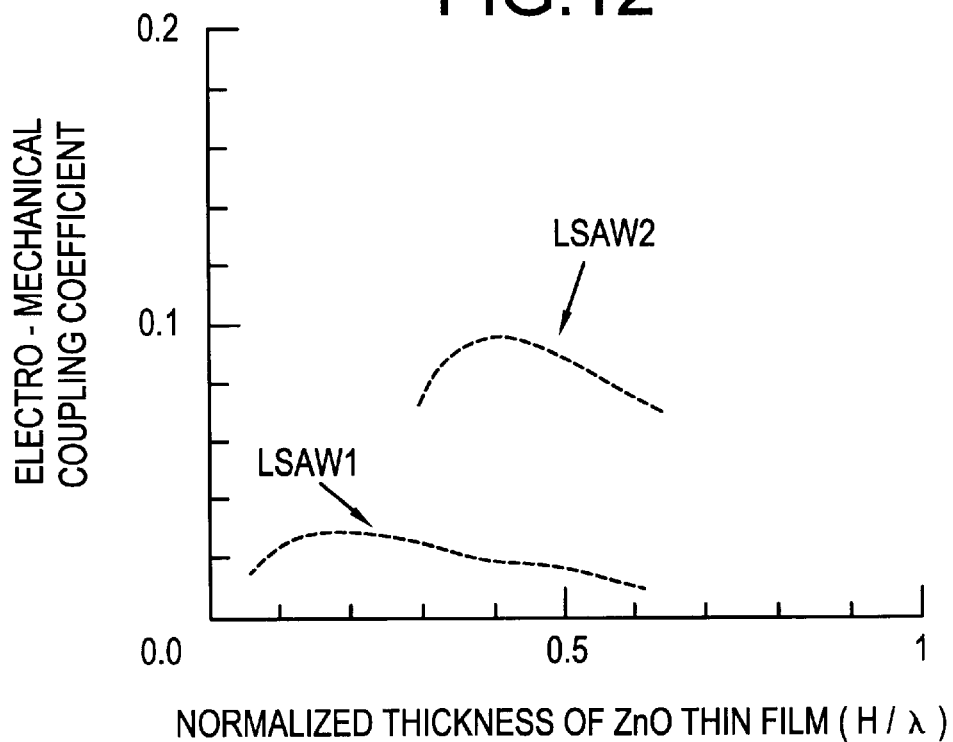
FIG. 12 is a graph showing the relationship between the normalized thickness $H/\lambda$ of a ZnO thin film and the electromechanical coupling coefficient of the surface acoustic wave devices according to the third preferred embodiment.

FIGS. 11 and 12 each show the relationship between the electro-mechanical coupling coefficient and the normalized thickness H/λ of the ZnO thin film in the surface acoustic wave devices fabricated as mentioned above. FIG. 11 shows characteristics achieved when comb electrodes are disposed on the upper surface of the ZnO thin film, and FIG. 12 shows characteristics achieved when comb electrodes are disposed on the upper surface of the ZnO thin film and short-circuiting electrodes preferably made of Al were disposed along the entire interface between the ZnO thin film and the quartz substrate.

As is apparent from FIGS. 11 and 12, in the case of using the quartz substrate having Eulerian angles (0, 150, 0), the surface acoustic wave device having a sufficiently large electromechanical coupling coefficient can also be achieved by using a surface acoustic wave substrate constructed by disposing a ZnO film on the quartz substrate.

Figure 13:
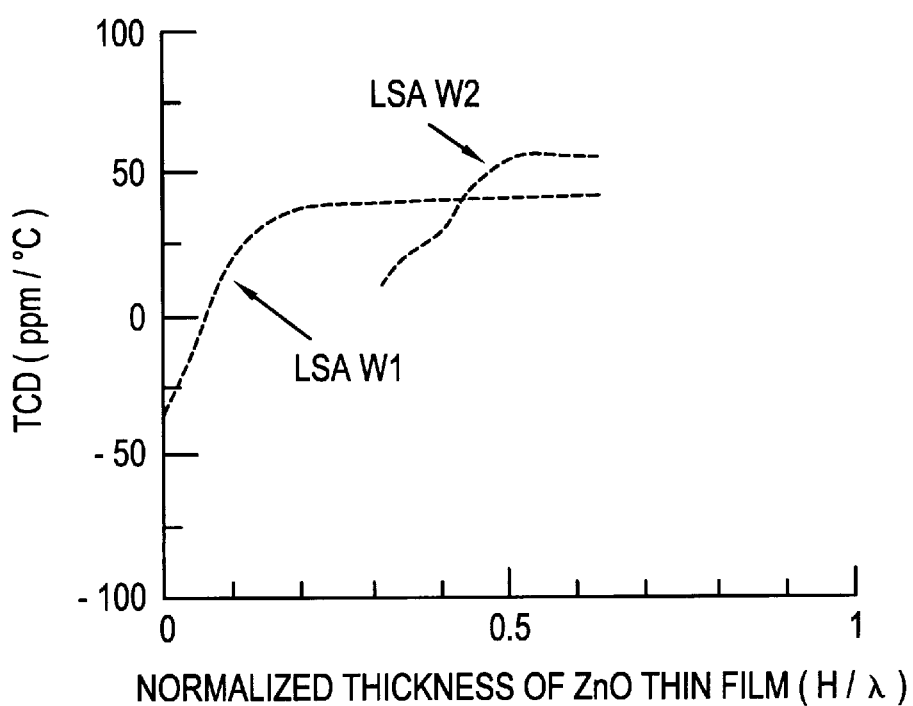
FIG. 13 is a graph showing the relationship between the normalized thickness $H/\lambda$ of a ZnO thin film and a temperature characteristic TCD of the surface wave devices according to the third preferred embodiment.

FIG. 13 is a graph showing the relationship between a temperature characteristic TCD and the normalized thickness H/λ of the ZnO thin film in the surface acoustic wave devices using the quartz substrates having Eulerian angles (0, 150, 0). As is apparent from FIG. 13, in these surface acoustic wave devices, the temperature characteristic TCD of the novel higher order mode LSAW2 of leakage elastic surface acoustic waves also shifts to the positive side by forming the ZnO thin film. It can be therefore understood that the surface acoustic wave device having a temperature characteristic TCD value of about ±0 can be achieved by a combination of a quartz substrate with a negative value of the temperature characteristic TCD and a ZnO thin film.

As described above, according to the surface acoustic wave device of the preferred embodiments of the present invention, since a piezoelectric thin film is disposed on the quartz substrate, comb electrodes are disposed in contact with the piezoelectric thin film, and the thickness of the piezoelectric thin film is selected to be able to generate and effectively use a novel higher order mode of leakage elastic surface acoustic waves, the resulting surface acoustic wave device can utilize the surface acoustic waves which have a higher sonic speed and a larger electro-mechanical coupling coefficient than obtainable with the conventional surface acoustic wave device constructed of a quartz substrate and utilizing Rayleigh waves. Therefore, the surface acoustic wave device of the preferred embodiments of the present invention is easily adaptable for operation at higher frequency.

In particular, by arranging the normalized thickness H/λ of the piezoelectric thin film to be in the range of from about 0.28 to about 0.6, the novel higher order mode of leakage elastic surface acoustic waves can be reliably generated and the decay constant which causes the leakage elastic surface acoustic waves to be attenuated is minimized.

Consequently, the preferred embodiments of the present invention can easily provide a surface acoustic wave device suitable for operation at higher frequency. In addition, since a quartz substrate having a good temperature characteristic is used, it is possible to easily provide a surface acoustic wave device which has a good temperature characteristic, i.e., which can exhibit stable characteristics regardless of ambient temperature changes.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A surface acoustic wave device comprising:
  a quartz substrate;
  a piezoelectric thin film disposed on said quartz substrate; and a plurality of comb electrodes disposed in contact with said piezoelectric thin film; wherein said piezoelectric thin film has a thickness that is sufficient to generate a Rayleigh wave, a lower order mode of leakage elastic surface acoustic waves and a higher order mode of leakage elastic surface acoustic waves and said plurality of comb electrodes are arranged so that said surface acoustic wave device operates with said higher order mode of leakage elastic surface acoustic waves.

2. A surface acoustic wave device according to claim 1, wherein said piezoelectric thin film has a thickness of H and said higher order mode of leakage elastic surface acoustic waves has a wavelength of $\lambda$, a normalized thickness $H/\lambda$ of said piezoelectric thin film with respect to said wavelength is in a range of from about 0.28 to about 0.6.

3. A surface acoustic wave device according to claim 1, wherein said piezoelectric thin film is formed of a material selected from the group consisting of ZnO, AlN, $Ta_2O_5$ and CdS.

4. A surface acoustic wave device according to claim 1, wherein a sonic velocity of said higher order leakage elastic surface acoustic waves is about 4,000 m/s to about 5,000 m/s.

5. A surface acoustic wave device comprising:

a quartz substrate;

a piezoelectric thin film disposed on said quartz substrate; and a plurality of comb electrodes disposed in contact with said piezoelectric thin film; wherein said quartz substrate, said piezoelectric thin film and said comb electrodes are adapted to generate a Rayleigh wave, a lower order mode of leakage elastic surface acoustic waves and a higher order mode of leakage elastic surface acoustic waves and to minimize a decay constant of said higher order mode of leakage elastic surface acoustic waves, wherein said plurality of comb electrodes are arranged so that said surface acoustic wave device operates with said higher order mode of leakage elastic surface acoustic waves.

6. A surface acoustic wave device according to claim 5, wherein said piezoelectric thin film has a thickness of H and said higher order mode of leakage elastic surface acoustic waves has a wavelength of $\lambda$, a normalized thickness $H/\lambda$ of said piezoelectric thin film with respect to said wavelength is in a range of from about 0.28 to about 0.6.

7. A surface acoustic wave device according to claim 5, wherein said piezoelectric thin film is formed of a material selected from the group consisting of ZnO, AlN, $Ta_2O_5$ and CdS.

8. A surface acoustic wave device according to claim 5, wherein a sonic velocity of said higher order leakage elastic surface acoustic waves is about 4,000 m/s to about 5,000 m/s.

* * * * *